US006361329B1

(12) United States Patent
Dekker et al.

(10) Patent No.: US 6,361,329 B1
(45) Date of Patent: Mar. 26, 2002

(54) HEADER OR RECEPTACLE FOR USE IN A POWER CONNECTOR AND PROCESS OF ASSEMBLING SAME

(75) Inventors: Jereon Sebastiaan Dekker, SK's-Hertogenbosch; Petrus Wouter Hendrikus Schalk, VS Drunnen, both of (NL)

(73) Assignee: FCI Americas Technology, Inc., Reno, NV (US)

( * ) Notice: Subject to any disclaimer, the term of this patent is extended or adjusted under 35 U.S.C. 154(b) by 0 days.

(21) Appl. No.: 09/621,467

(22) Filed: Jul. 21, 2000

(30) Foreign Application Priority Data

Jul. 23, 1999 (NL) ............................................ 1012696

(51) Int. Cl.[7] ........................... H01R 12/00; H05K 1/00
(52) U.S. Cl. .......................... 439/79; 439/752; 439/942
(58) Field of Search ............................ 439/752, 79, 80, 439/686, 598, 744, 942

(56) References Cited

U.S. PATENT DOCUMENTS 4,900,258 A * 2/1990 Hnatuck et al. .............. 439/63
5,643,016 A 7/1997 Huss, Jr. ..................... 439/744

FOREIGN PATENT DOCUMENTS

EP 0337659 A1 10/1989
EP 0520283 A1 12/1992

* cited by examiner

*Primary Examiner*—Brian Sircus
*Assistant Examiner*—Javaid Nasri
(74) *Attorney, Agent, or Firm*—Perman & Green, LLP

(57) ABSTRACT

The invention pertains to a header or receptacle for use in a power connector, comprising a housing provided with at least two power contact elements having a mating end, a retaining portion for retaining the contact element in the housing, and a tail for connecting the contact element to a printed circuit board, cable, or the like. The retaining portion of the contact element and, preferably, also the mating end are cylindrical and a fixation element is placed between the tails, thus fixing the position of the tails relative to one another and avoiding contact between the mating ends of the contact elements.

9 Claims, 2 Drawing Sheets

HEADER OR RECEPTACLE FOR USE IN A POWER CONNECTOR AND PROCESS OF ASSEMBLING SAME

BACKGROUND OF THE INVENTION

The invention relates to a header (also denoted as plug) or receptacle (also denoted as socket) for use in a power connector (i.e. the combination of a header and receptacle), comprising a housing of an electrically insulating material and provided with at least two power contact elements having a mating end, a retaining portion for retaining the contact element in the housing, and a tail for connecting the contact element to a printed circuit board, cable, or the like.

Such headers and receptacles are known and are usually employing contacts in the form of so-called blade power contacts. Blade contacts can be used for currents up to 3 amp per contact, which in a commonly used 12 mm 2×4 module results in a maximum current of 24 amp.

Although blade contacts offer sufficient capacity for many applications, a permanent need exists for increasing the power of the connectors without increasing their dimensions or production costs.

SUMMARY OF THE INVENTION

The invention aims to provide a connector of the above mentioned type which can operate at a higher amperage without increasing dimensions or costs.

To this end the connector of the invention is characterized in that the retaining portion of the contact element is cylindrical and a fixation element is placed between the tails, which fixes the position of the tails relative to one another so as to avoid contact between the mating ends and/or the tails of the contact elements.

It was found that with the headers and receptacles according to the invention, the contact elements can be fitted into existing mini coax housings. In coax applications, already a complete "family" is available with straight, right angle and cable connectors. While for coax contacts it is not a problem that the ground (outer) contact of two adjacent contact elements contact each other (in fact, they are often combined), this is absolutely not allowed for the circular power contact, as this would mean a short circuit. By employing the said fixation element the position of the mating end of the contact elements becomes sufficiently stable to avoid a short circuit.

Thus, the mini coax housings, which would normally not be considered for use in power applications, can be used in power connectors and there is no need for a new design or new (expensive) moulds.

In a preferred embodiment, the mating end of the contact elements are cylindrical. It was found that by increasing the circumferential surface of the mating end (when compared to flat blade contacts), the amperage can at least be doubled.

In a further preferred embodiment the end part of the tail of at least one of the contact elements builds an angle with the rest of the tail, which angle preferably is equal to or substantially equal to 90 degrees.

In this preferred embodiment special care should be taken to avoid the said short circuit. To this end, it is preferred that at least part of the end of the tail portion that builds an angle with the rest of the tail portion is separated from the tail portion of neighbouring contact elements by means of a partition wall.

BRIEF DESCRIPTION OF THE DRAWINGS

The invention will be further explained by reference to the drawings in which an embodiment of the connector of the invention is schematically shown.

DETAILED DESCRIPTION OF THE INVENTION

Figure 1:
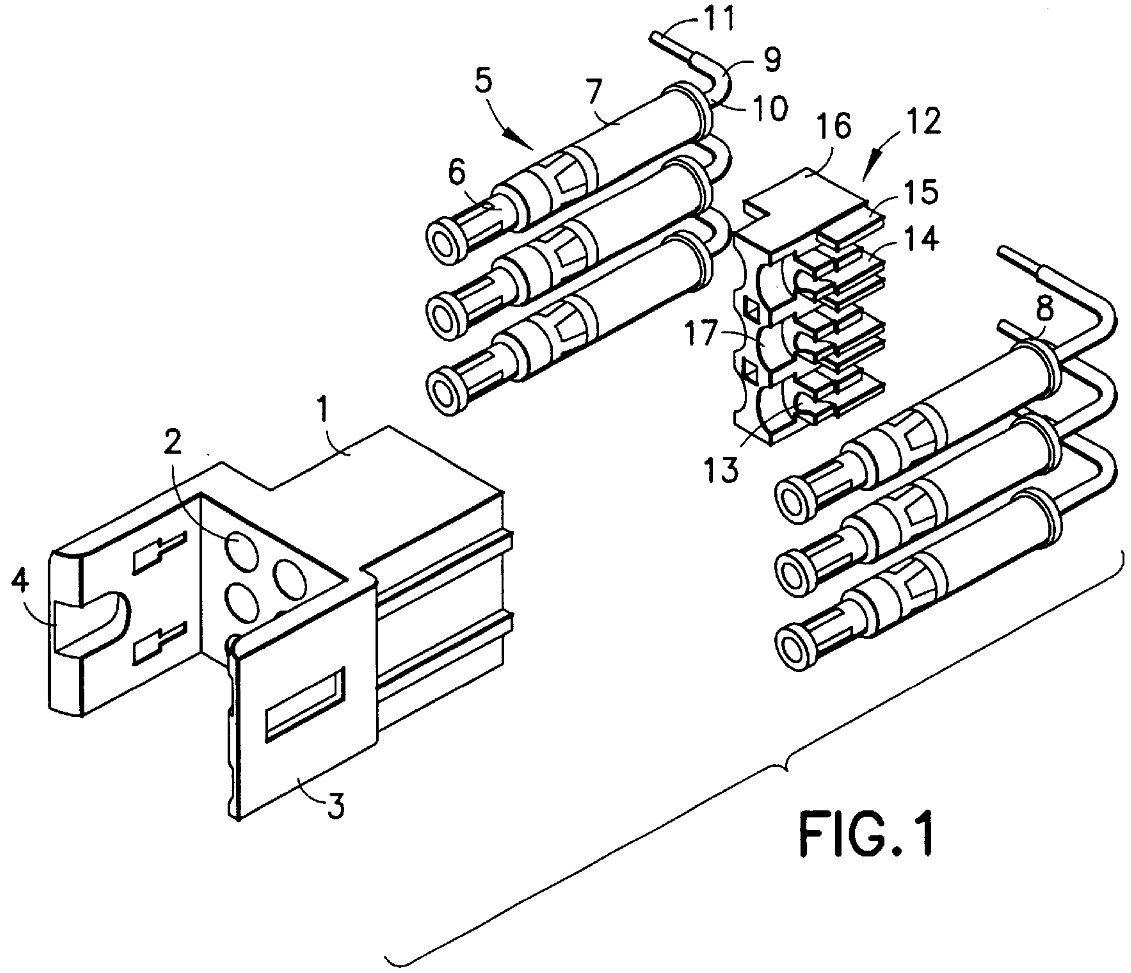
FIGS. 1, 2 and 3 show various steps of the assembly of a header in accordance with the present invention.
Figure 4:
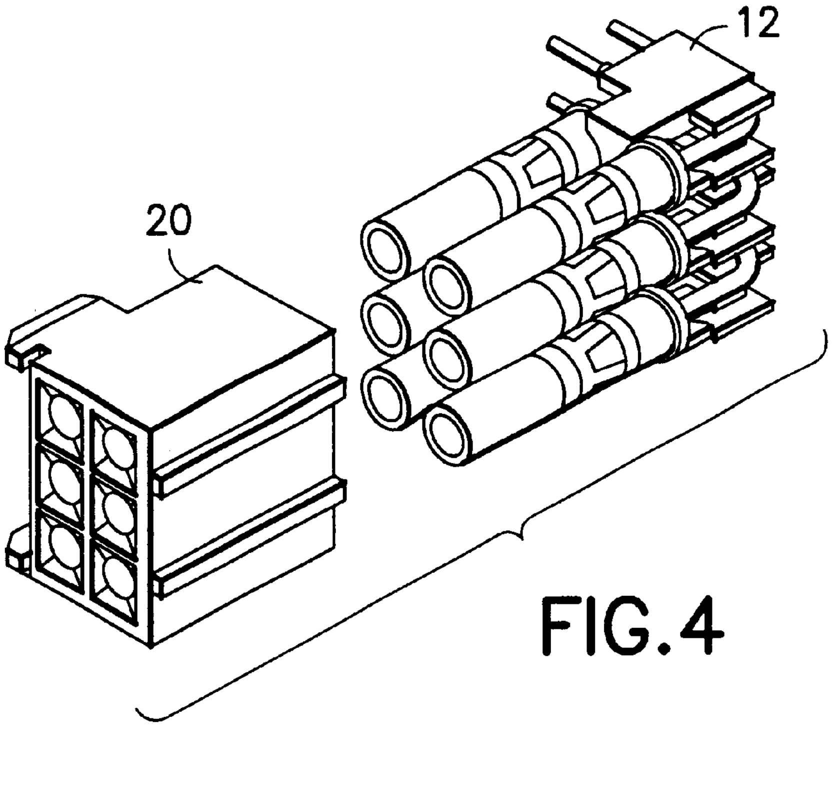
FIG. 4 shows a receptacle according to the present invention just prior to insertion of the contact elements into the housing.

FIG. 1 shows a housing 1 of a header or plug provided with cylindrical cavities 2, and walls 3 for connecting the housing 1 of the header to the housing 20 of a receptacle or socket (shown in FIG. 4). The housing 1 is made by the injection moulding of a Liquid Crystalline Polymer (LCP) containing glass particles into an existing mould which was designed for manufacturing housings for mini coax contacts.

The said walls 3 are also provided with means 4 for aligning the header housing 1 with a receptacle housing. FIG. 1 further shows contact elements 5, each comprising a cylindrical mating end 6, a cylindrical retaining portion 7, for retaining the contact element 5 in the cavities 2 of the header housing 1, a cylindrical boss 8, which serves as a stop during and after assembly of the header, and a right angle (RA) tail 9.

The tail 9 comprises an axial section 10 and a perpendicular section 11, the latter being partially stripped to facilitate electrical connection to, e.g., a printed circuit board.

Prior to the insertion of the contact elements 5 into the housing 1, the tails 9 of said contact elements 5 are attached to a fixation element 12, which is sometimes also denoted a wafer, by means of clips 13. Clips 13 are provided with a cylindrical cavity and an opening with a width that is slightly smaller than the outer diameter of the tail of the contact element 5 and which, thus, allows snap connection of the said contact elements 5 to the fixation element 12. The fixation element thus not only serves to maintain an accurately defined position of the contact elements 5 in the header, but it also serves to initially achieve the said accurately defined position.

A further advantage of the accurately defined position resides in that the perpendicular section of the tails can be made longer, thus allowing a greater distance between the header or receptacle and, e.g., a printed circuit board and enabling more effective cooling of those parts in which the highest heat dissipation occurs, i.e. the soldertail attachment of the contact elements to, e.g., the printed circuit board or cable.

It is preferred that the number and the position of clips on the fixation element 12 corresponds to the number and the position of cavities in the header housing 1. For example, a fixation element for use in a housing 1 comprising 2×3 cavities 2 should exhibit 2×3 clips 13.

It is further preferred that the cavities 2 and the clips 13 are positioned such that, upon insertion of the assembly of the fixation element 12 and the contact elements 5 into the header housing 1, their center lines lie on a common axis.

The fixation element 12 shown in FIG. 1 may be manufactured with the same material as header housing 1. It further comprises partition walls 14 and 15 so as to reduce the possibility of short circuit between the axial sections 10 of the tails of contact elements 5 and partition walls 16 to avoid short circuit between the perpendicular sections 11 of the said tails 9 to further limit the freedom of movement, in particular rotation, of the contact elements 5.

It will be clear from the above explanations that the shape of the fixation element can be made partly of even wholly complementary to the shape of (a set) of contact elements. E.g., the fixation elements can also be provided with recesses 17 to accommodate the bosses 8 of the contact elements 5.

Figure 2:
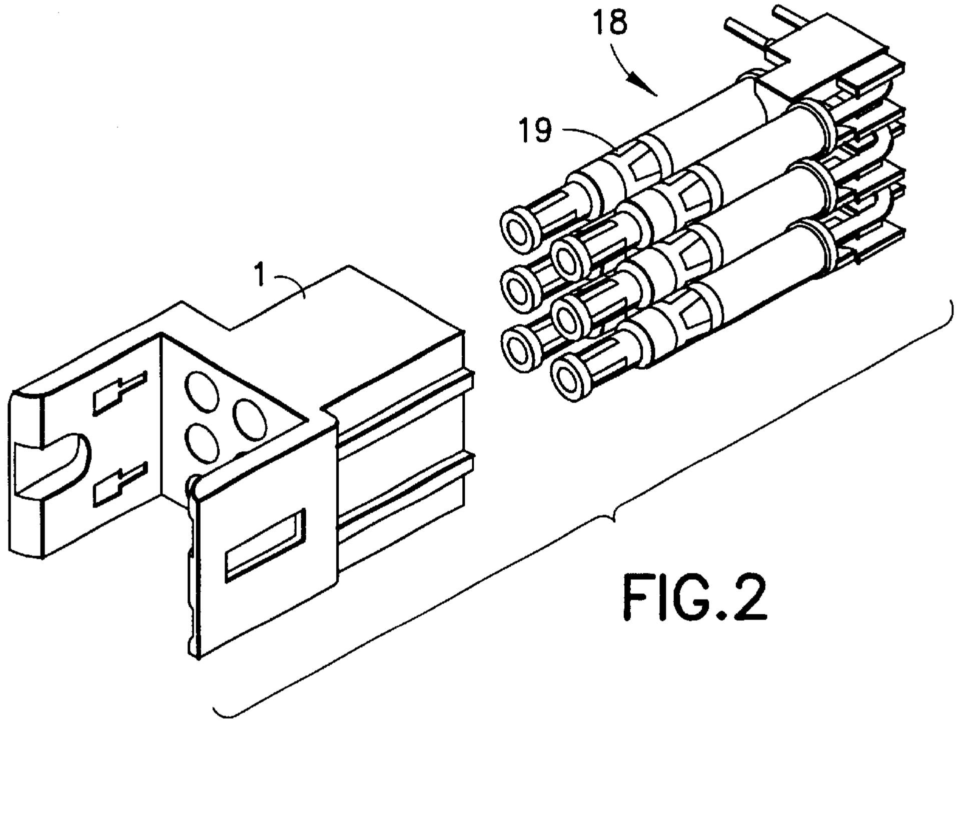

FIG. 2 shows an assembly 18, comprising six (2×3) contact elements 5 attached to a fixation element 12, just prior to insertion into the housing 1. To ensure retention of the said assembly 18 into the housing 1 spring latches 19 are provided on the retaining portion of the contact elements 5.

Figure 3:
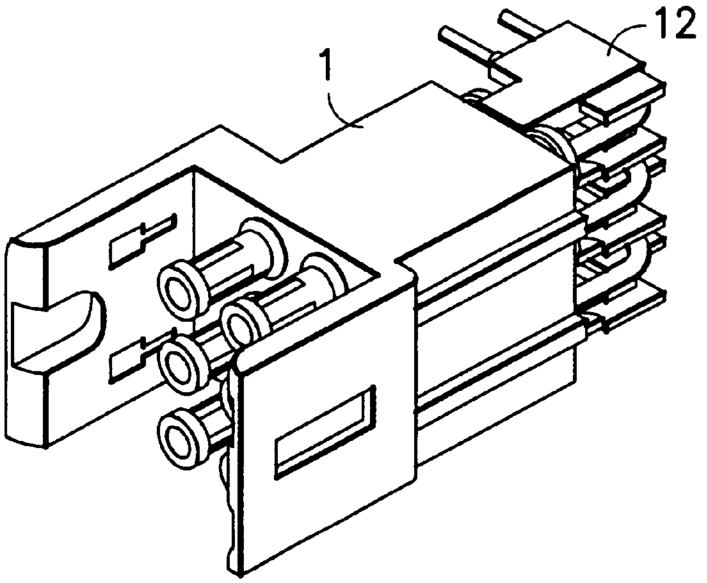

FIG. 3 shows a header according to the present invention in assembled condition.

FIG. 4 shows a receptacle in accordance with the present invention which can be assembled in a way similar to that of the assembly of the aforementioned header.

The invention further pertains to a connector comprising a header and/or a receptacle according to any one of the preceding claims and to a process for assembling the said header or receptacle, wherein the tails of at least two contact elements are attached to a fixation element and the contact elements are subsequently inserted into a housing. With this process, one can load the contact elements manually into the fixation element. Selective loading, e.g. by loading 4 contact elements into a 3×3 fixation element, is also possible as long as there is a minimum of two contact elements.

The invention is not restricted to the above described embodiments which can be varied in a number of ways within the scope of the claims.

What is claimed is:

1. A header or receptacle for use in a power connector, comprising a housing provided with at least two power contact elements each having a mating end, a retaining portion for retaining the contact element in the housing, and a tail for connecting the contact element to a printed circuit board or a cable wherein the retaining portions of each of the contact elements are cylindrical and a fixation element is placed between the tails of the contact elements, the fixation element fixing the position of the tails relative to one another so as to avoid contact between the mating ends and/or the tails of the contact elements, wherein the fixation element includes partition walls separating at least part of each tail from neighboring tails in order to avoid short circuits between the tails and wherein the fixation element is attached to the tails of the at least two contact elements by means of a snap-fit connection.

2. The header or receptacle according to claim 1, wherein an end section of the tails of the contact elements is bent through an angle with respect to a remaining section of the tail and wherein the partition walls separate at least part of each remaining section of the tails from the tail of a neighboring contact.

3. The header or receptacle according to claim 2, wherein the angle is equal to or substantially equal to 90 degrees.

4. The header or receptacle according to claim 2, wherein at least part of the end sections of the tails are also separated from the tail of a neighboring contact element by means of partition walls.

5. The header or receptacle according to claim 1, wherein the housing comprises at least two rows of at least two cavities each.

6. The header or receptacle according to claim 5, wherein the cavities in the housing are cylindrical.

7. Process for assembling a header or receptacle according to claim 1, wherein the tails of at least two contact elements are first attached to the fixation element and the contact elements with the fixation element attached are subsequently inserted into the housing.

8. The header or receptacle according to claim 1 wherein the mating end is cylindrical.

9. The header or receptacle according to claim 1 which can operate at a higher amperage than 3 amps per contact.

* * * * *